United States Patent
Jeong

(10) Patent No.: US 11,662,775 B2
(45) Date of Patent: May 30, 2023

(54) DISPLAY APPARATUS

(71) Applicant: SAMSUNG DISPLAY CO., LTD., Yongin-si (KR)

(72) Inventor: Kwang Jin Jeong, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 389 days.

(21) Appl. No.: 16/907,689

(22) Filed: Jun. 22, 2020

(65) Prior Publication Data
US 2021/0124399 A1 Apr. 29, 2021

(30) Foreign Application Priority Data
Oct. 23, 2019 (KR) .................. 10-2019-0132110

(51) Int. Cl.
*G06F 1/00* (2006.01)
*G06F 1/16* (2006.01)
*G09F 9/30* (2006.01)

(52) U.S. Cl.
CPC ............ *G06F 1/1652* (2013.01); *G09F 9/301* (2013.01)

(58) Field of Classification Search
CPC ............................... G06F 1/1652; G09F 9/301
See application file for complete search history.

(56) References Cited

U.S. PATENT DOCUMENTS

| | | | |
|---|---|---|---|
| 10,103,179 B2 | 10/2018 | Kwon et al. | |
| 10,651,247 B2* | 5/2020 | Yan ...................... | H01L 51/0097 |
| 2014/0183473 A1* | 7/2014 | Lee ...................... | H01L 51/0097 |
| | | | 257/40 |
| 2015/0146386 A1* | 5/2015 | Namkung .............. | H05K 1/028 |
| | | | 361/749 |

FOREIGN PATENT DOCUMENTS

| | | |
|---|---|---|
| CN | 103943788 | 7/2014 |
| CN | 106206962 | 12/2016 |
| KR | 10-2014-0085956 | 7/2014 |

* cited by examiner

*Primary Examiner* — Pete T Lee
(74) *Attorney, Agent, or Firm* — Lewis Roca Rothgerber Christie LLP

(57) ABSTRACT

A display apparatus includes: a display panel including a light emitting structure and including a main display area, a left edge display area adjacent to the main display area, and a right edge display area adjacent to the main display area; and a first pattern film attached under the display panel and overlapping with the main display area and the left and right edge display areas, the first pattern film having a stiffness higher than a stiffness of the display panel, and a stress dispersing portion is located on the first pattern film.

17 Claims, 11 Drawing Sheets

DISPLAY APPARATUS

CROSS-REFERENCE TO RELATED APPLICATION

This application claims priority to and the benefit of Korean Patent Application No. 10-2019-0132110, filed on Oct. 23, 2019 in the Korean Intellectual Property Office, the entire disclosure of which is incorporated herein by reference.

BACKGROUND

1. Field

Aspects of embodiments of the present disclosure relate to a display apparatus.

2. Description of the Related Art

Recently, as the technology improves, display products having smaller sizes, lighter weights, and superior performance have been produced. Conventional cathode ray tube (CRT) televisions have been widely used for display apparatuses with many advantages in terms of performance and price. Recently, however, a display apparatus, such as a plasma display apparatus, a liquid crystal display apparatus, and an organic light emitting display apparatus, which overcomes shortcomings of the CRT in terms of miniaturization or portability and has advantages such as miniaturization, light weight and low power consumption, has been spotlighted.

In particular, various structures for reducing a bezel portion, which is a non-display area surrounding a display area of the display apparatus, have been proposed. In addition, a structure in which a portion of the display apparatus is bent has been proposed, but there is a problem of breakage or cracking due to the bending.

SUMMARY

According to an aspect of embodiments of the present disclosure, a display apparatus includes a curved surface. According to another aspect of embodiments of the present disclosure, a display apparatus having reduced breakage or cracking at a bent portion thereof and a reduced bezel portion which is a non-display area is provided.

According to one or more embodiments, a display apparatus includes: a display panel including a light emitting structure and including a main display area, a left edge display area adjacent to the main display area, and a right edge display area adjacent to the main display area; and a first pattern film attached under the display panel and overlapping with the main display area and the left and right edge display areas, the first pattern film having a stiffness higher than a stiffness of the display panel, and a stress dispersing portion may be located on the first pattern film.

In one or more embodiments, the stress dispersing portion may include an opening in a form of a slit.

In one or more embodiments, the opening may extend along a curved line.

In one or more embodiments, the opening may have an arc shape.

In one or more embodiments, the opening may include a plurality of slits concentrically arranged in an arc shape.

In one or more embodiments, the left edge display area may include a first left edge display area adjacent to the main display area, and second and third left edge display areas adjacent to opposite longitudinal ends of the first left edge display area, respectively, and the stress dispersing portion may be located in the second left edge display area and the third left edge display area.

In one or more embodiments, the stress dispersing portion may include a groove located on a surface of the first pattern film.

In one or more embodiments, the surface of the first pattern film on which the groove is located may contact the display panel.

In one or more embodiments, the surface of the first pattern film on which the groove is located may contact the display panel.

In one or more embodiments, the groove may have a shape defined by a plurality of arcs that are concentrically arranged.

In one or more embodiments, the left edge display area and the right edge display area may be bent in a direction perpendicular to the main display area to define curved surfaces, respectively, and a neutral plane of the curved surface may be located in the display panel such that compression is applied to the first pattern film.

In one or more embodiments, the display panel may further include a bending area adjacent to the main display area, and the bending area may be bent in a direction perpendicular to the main display area such that a part of the bending area faces a rear surface of the main display area to overlap with the main display area.

In one or more embodiments, the display apparatus may further include a second pattern film attached under the bending area of the display panel.

In one or more embodiments, the display panel may include a flexible organic light emitting display panel, and the light emitting structure may include a first electrode, an organic light emitting layer on the first electrode, and a second electrode on the organic light emitting layer.

In one or more embodiments, the first pattern film may include polyethylene terephthalate (PET).

According to one or more embodiments, a display apparatus includes: a display panel including a main display area on a plane defined in a first direction and a second direction perpendicular to the first direction, and a curved display area adjacent to the main display area and bent with respect to the plane in a third direction perpendicular to the first and second directions; and a pattern film attached under the display panel, and a groove or a slit opening may be located in a portion of the pattern film overlapping with the curved display area.

In one or more embodiments, a neutral plane of the curved display area may be located in the display panel such that compression is applied to the pattern film.

In one or more embodiments, the curved display area may extend in the second direction, and the groove or the slit opening may be located at opposite ends of the curved display area in the second direction.

In one or more embodiments, the opposite ends of the curved display area in the second direction may have a rounded edge shape, and the groove or the slit opening may have a curved shape adjacent to the rounded edge shape.

According to an aspect of embodiments of the present disclosure, a display apparatus may include a display panel having a light emitting structure and including a main display area and a curved display area adjacent to the main display area, and a first pattern film attached to a lower portion of the display panel (i.e., under the display panel) while overlapping with the main display area and the curved display area and having a stiffness higher than that of the display panel. Stress may be dispersed in the first pattern film by a stress dispersing portion in the form of a slit opening or a groove, thereby preventing or substantially preventing a material constituting the first pattern film from being pushed out and/or swollen, such that breakage and cracking of the display panel may be prevented or substantially prevented at an edge of the display panel.

BRIEF DESCRIPTION OF THE DRAWINGS

Some illustrative, non-limiting example embodiments will be described in the following detailed description in conjunction with the accompanying drawings.

DETAILED DESCRIPTION

Figure 1:
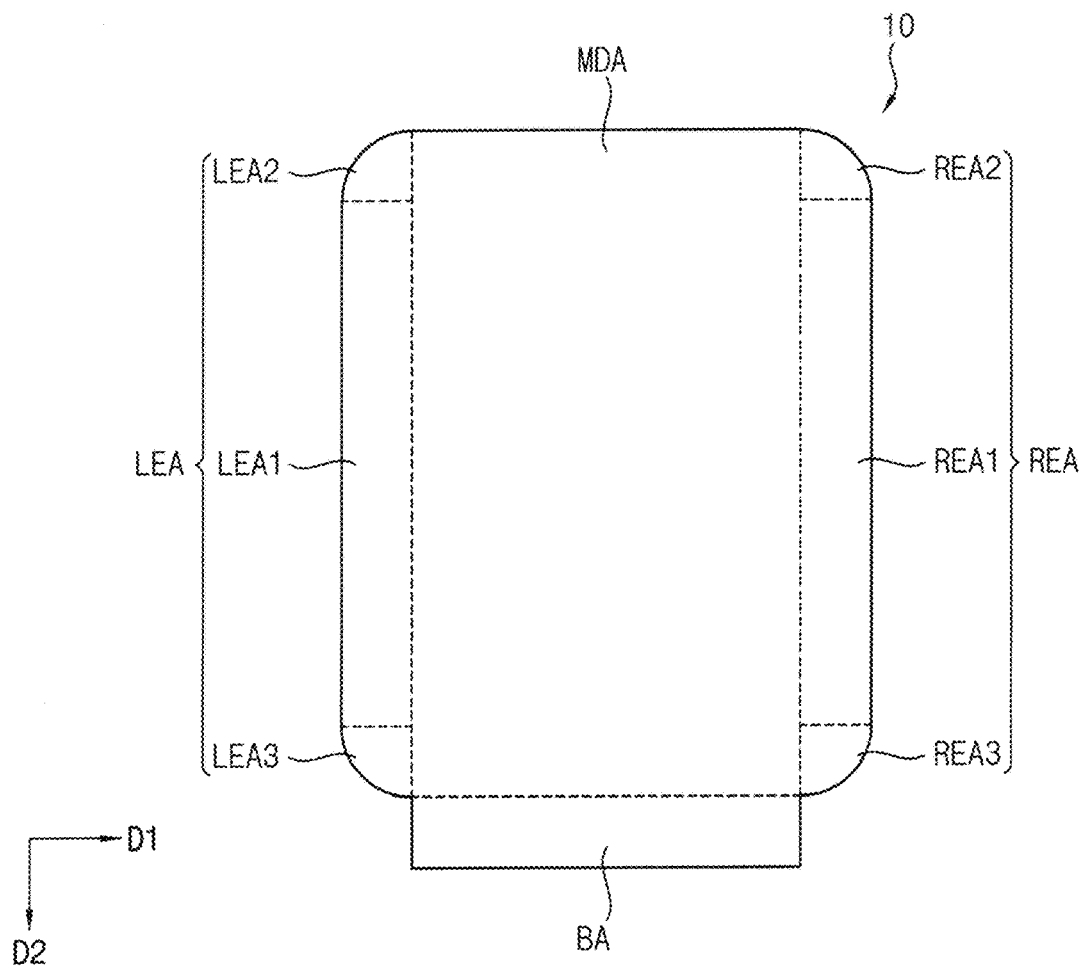
FIG. 1 is a plan view illustrating a display apparatus according to one or more example embodiments.

Herein, some example embodiments of the present inventive concept will be described in further detail with reference to the accompanying drawings. The inventive concepts may, however, be embodied in many different forms, and should not be construed as limited to the embodiments set forth herein.

In the present disclosure, it is to be understood that when an element or layer is referred to as being "on," "connected to," or "coupled to" another element or layer, it may be directly on, connected, or coupled to the other element or layer, or one or more intervening elements or layers may be present.

Like numerals refer to like elements throughout. In the drawings, the thickness, ratio, and dimensions of components may be exaggerated for ease of description of the technical content.

As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a "second" element, component, region, layer, or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

Figure 2:
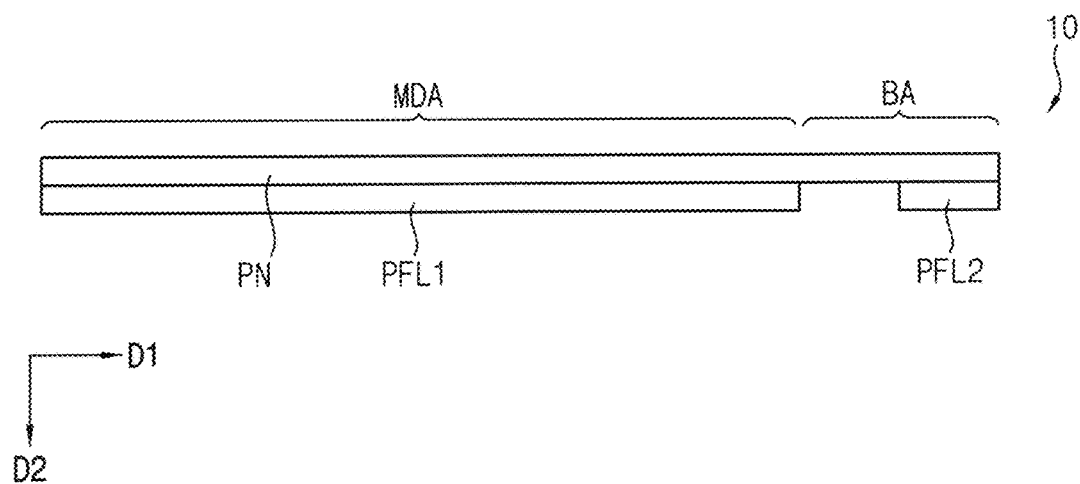
FIG. 2 is a cross-sectional view of the display apparatus of FIG. 1 taken along a second direction.

FIG. 1 is a plan view illustrating a display apparatus according to one or more example embodiments; and FIG. 2 is a cross-sectional view of the display apparatus of FIG. 1 taken along a second direction.

Referring to FIGS. 1 and 2, a display apparatus 10 according to one or more embodiments may include a display panel PN, a first pattern film PFL1, and a second pattern film PFL2.

The display panel PN may include a display area where an image is displayed, and a non-display area (not shown) around (e.g., surrounding) the display area. In an embodiment, the display area may include a main display area MDA, a right edge display area REA, and a left edge display area LEA.

The main display area MDA may be disposed on a plane formed in a first direction D1 and a second direction D2 perpendicular to the first direction D1.

The right edge display area REA may extend in the second direction D2 and may be adjacent to the main display area MDA in the first direction D1. The right edge display area REA may be a curved display area which is bent in a third direction D3 perpendicular to the first and second directions D1 and D2 with respect to the plane on which the main display area MDA is disposed.

The right edge display area REA may include a first right edge display area REA1, a second right edge display area REA2, and a third right edge display area REA3. The first right edge display area REA1 may be adjacent to the main display area MDA in the first direction D1. The second right edge display area REA2 and the third right edge display area REA3 may be adjacent to opposite longitudinal ends of the first right edge display area REA1, that is, may be adjacent to opposite ends defined in the second direction D2.

The left edge display area LEA may extend in the second direction D2 and may be adjacent to the main display area MDA in the first direction D1. The left edge display area LEA may be a curved display area which is bent in a third direction D3 perpendicular to the first and second directions D1 and D2 with respect to the plane on which the main display area MDA is disposed.

The left edge display area LEA may include a first left edge display area LEA1, a second left edge display area LEA2, and a third left edge display area LEA3. The first left edge display area LEA1 may be adjacent to the main display area MDA in the first direction D1. The second left edge display area LEA2 and the third left edge display area LEA3 may be adjacent to opposite longitudinal ends of the first left edge display area LEA1, respectively, that is, may be adjacent to opposite ends defined in the second direction D2.

In an embodiment, the display area including the main display area MDA, the left edge display area LEA, and the right edge display area REA may have a rectangular shape as a whole with rounded edges. That is, the second and third left edge display regions LEA2 and LEA3 and the second and third right edge display regions REA2 and REA3 may have rounded edge shapes.

In an embodiment, the display panel PN may further include a bending area BA. The bending area BA may be bent in a direction perpendicular to the main display area PN, that is, in a third direction D3 perpendicular to the first direction D1 and the second direction D2, such that a part of the bending area BA may be disposed to face a rear surface of the main display area MDA to overlap with the main display area MDA. In an embodiment, a driving circuit for driving the display apparatus and a front portion of a pad to be connected to an external device may be disposed in the bending area BA.

The first pattern film PFL1 may be attached under the display panel PN to overlap with the main display area MDA and the left and right edge display areas LEA and REA. In an embodiment, the first pattern film PFL1 may have a stiffness higher than that of the display panel. In an embodiment, the first pattern film PFL1 may be formed of a material such as a synthetic resin. For example, the first pattern film PFL1 may include polyethylene terephthalate (PET).

The second pattern film PFL2 may be attached under the display panel PN to overlap with a portion of the bending area BA. In an embodiment, the second pattern film PFL2 may be spaced apart from the first pattern film PFL1 and may be formed of a material the same as the first pattern film PFL1.

In an embodiment, the display panel PN may be a flexible organic light emitting display panel. For example, the display panel may include a flexible base substrate, a thin film transistor and a circuit wiring disposed on the flexible base substrate, a first electrode electrically connected to the thin film transistor and the circuit wiring, a light emitting layer disposed on the first electrode, and a second electrode disposed on the light emitting layer. The display panel may be a flexible display panel having any of various well-known structures, so a further detailed description thereof will be omitted.

Figure 3:
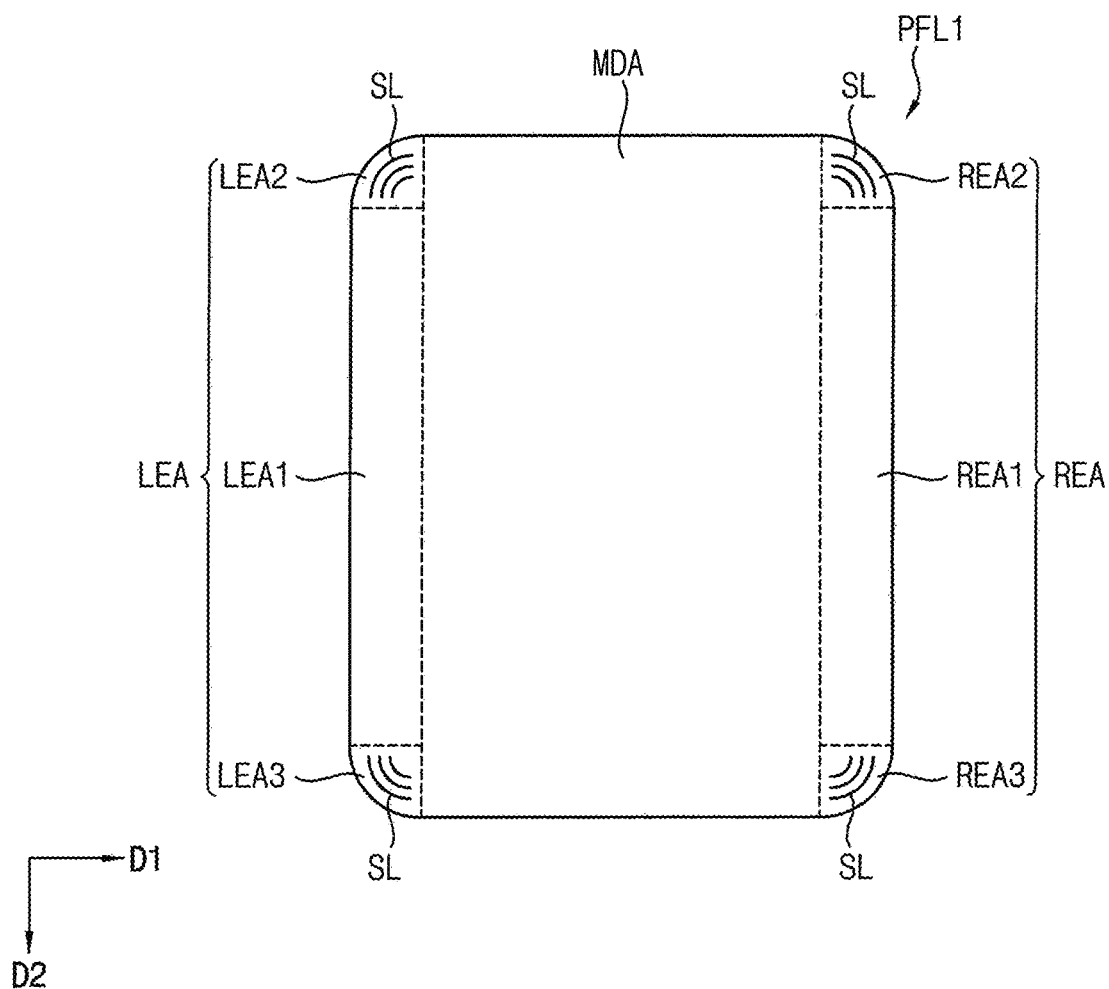
FIG. 3 is a plan view illustrating a first pattern film in the display apparatus of FIG. 1.

FIG. 3 is a plan view illustrating the first pattern film PFL1 in the display apparatus of FIG. 1, according to one or more embodiments.

Referring to FIGS. 1 to 3, slit openings SL, which are stress dispersion portions, may be formed corresponding to four edges of the first pattern film PFL1 of the display apparatus, that is, the second left edge display area LEA2, the third left edge display area LEA3, the second right edge display area REA2, and the third right edge display area REA3.

That is, the slit openings SL may be formed in portions that overlap the second left edge display area LEA2, the third left edge display area LEA3, the second right edge display area REA2, and the third right edge display area REA3 of the display panel PN.

In an embodiment, the slit opening SL may be formed along a curved line. For example, the slit opening SL may have a curved shape corresponding to a rounded edge shape of an edge of the edge display areas. For example, the slit opening SL may have an arc shape defined by a plurality of slits which are concentrically arranged. The slit opening SL may be formed in the first pattern film PFL1 by a process (e.g., a predetermined process), such as laser cutting.

Although the slit opening SL has been described as being formed along a curved line in an embodiment, embodiments of the present inventive concept are not limited thereto. For example, the slit opening SL may have a straight line shape extending in the first direction D1 and the second direction D2, or a straight line shape extending in a direction inclined from the first direction D1 by an angle (e.g., a predetermined angle).

Figure 4:
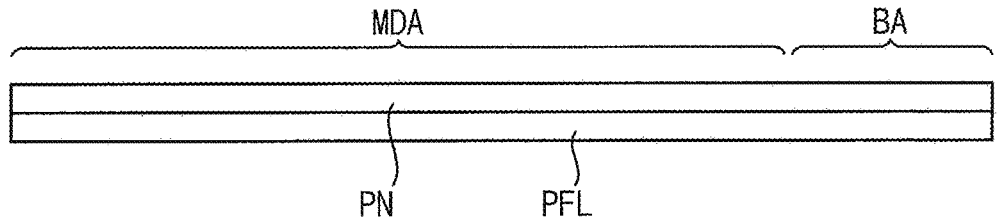
FIG. 4 is a cross-sectional diagram illustrating a display apparatus according to one or more example embodiments.
Figure 5:
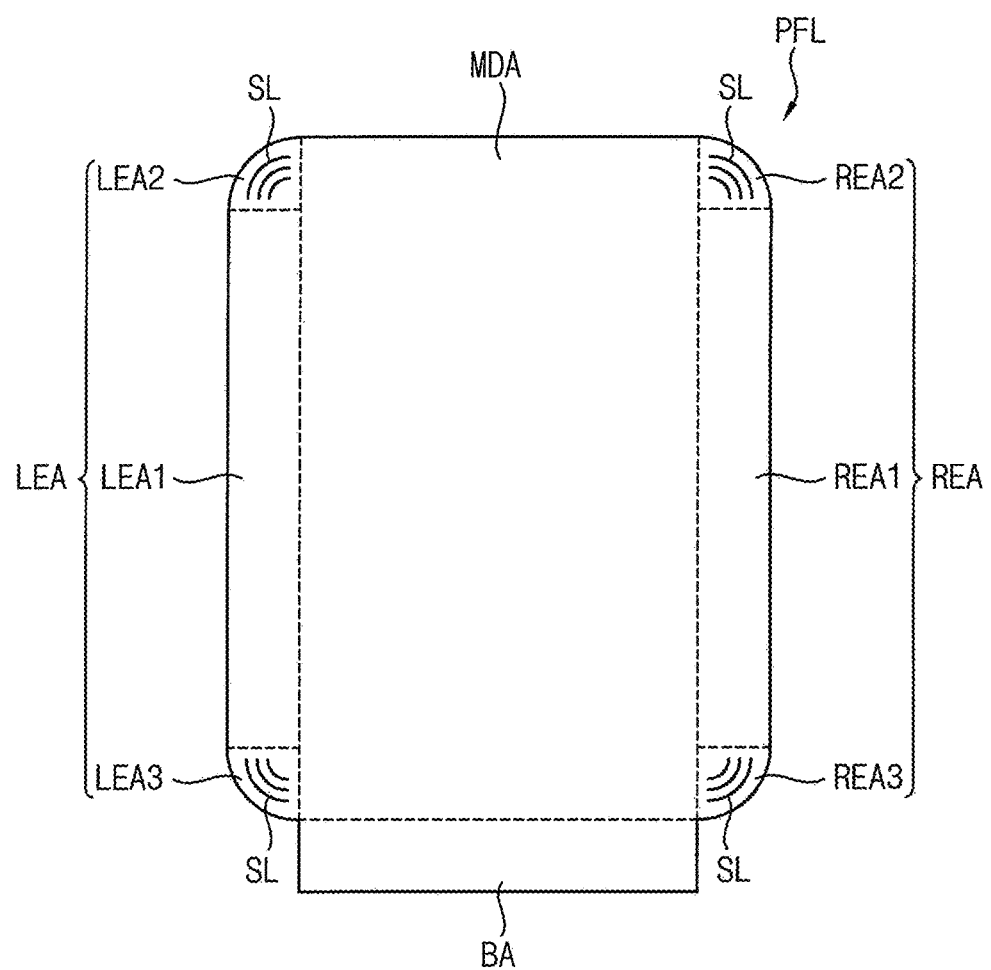
FIG. 5 is a plan view illustrating a pattern film in the display apparatus of FIG. 4.

FIG. 4 is a cross-sectional view illustrating a display apparatus according to one or more example embodiments; and FIG. 5 is a plan view illustrating a pattern film in the display apparatus of FIG. 4.

Referring to FIGS. 4 and 5, the display apparatus may include a display panel PN and a pattern film PFL. The display apparatus may be substantially the same as the display apparatus shown in FIGS. 1 to 3 except that the pattern film PFL is integrally formed without being divided. Therefore, further repeated descriptions thereof may be omitted below.

The pattern film PFL may include a main display area MDA, a right edge display area REA, a left edge display area LEA, and a bending area BA. The right edge display area REA may include a first right edge display area REA1, a second right edge display area REA2, and a third right edge display area REA3. The left edge display area LEA may include a first left edge display area LEA1, a second left edge display area LEA2, and a third left edge display area LEA3.

Slit openings SL, which are stress dispersing portions, may be formed corresponding to four edges of the pattern film PFL, that is, the second left edge display area LEA2, the third left edge display area LEA3, the second right edge display area REA2, and the third right edge display area REA3.

Figure 6:
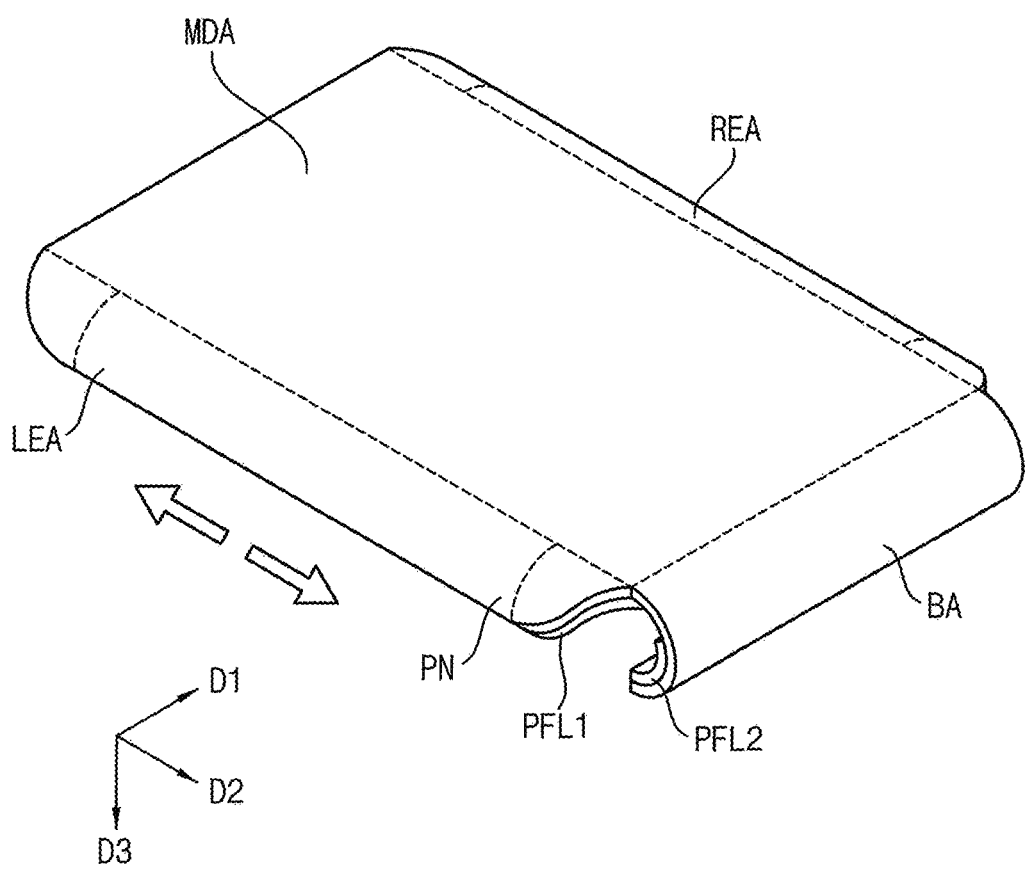
FIG. 6 is a perspective view illustrating a state in which a right edge display area, a left edge display area, and a bending area in the display apparatus of FIG. 1 are bent.
Figure 7A:
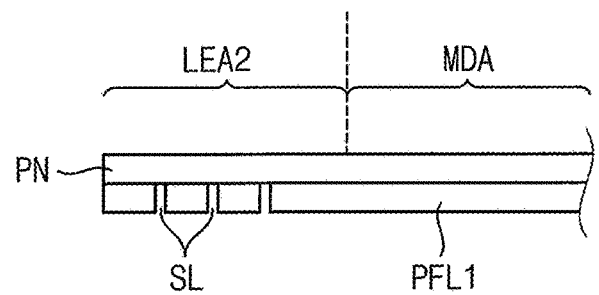
FIG. 7A is a cross-sectional view of a periphery of a second left edge display area taken along a first direction in an unfolded state of the display apparatus of FIG. 1.
Figure 7A:
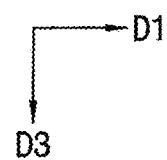
Figure 7B:
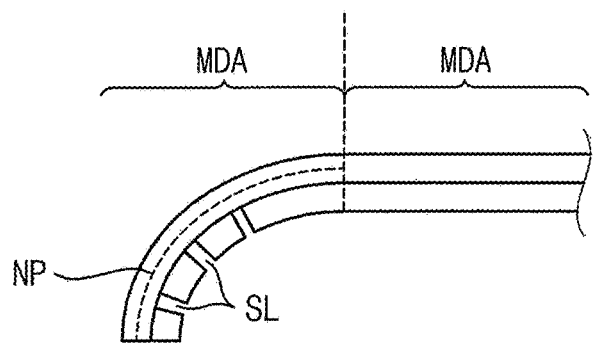
FIG. 7B is a cross-sectional view of a periphery of a second left edge display area taken along a first direction in a folded state of the display apparatus of FIG. 1.
Figure 7B:
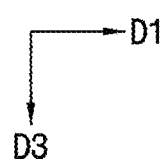
Figure 8A:
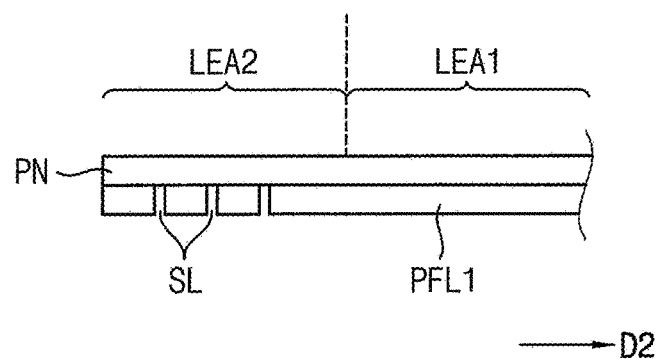
FIG. 8A is a cross-sectional view of a periphery of a second left edge display area taken along a second direction in an unfolded state of the display apparatus of FIG. 1.
Figure 8B:
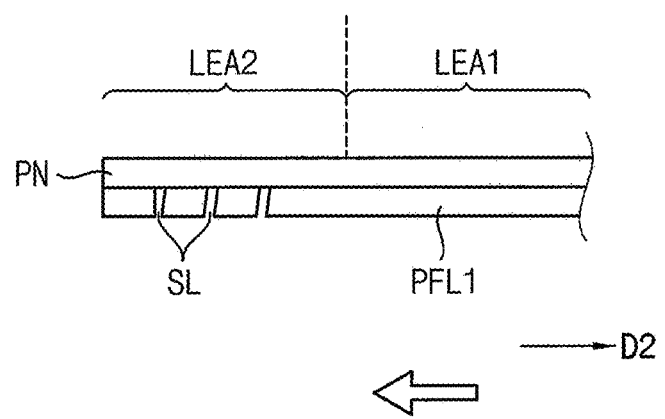
FIG. 8B is a cross-sectional view of a periphery of a second left edge display area taken along a second direction in a folded state of the display apparatus of FIG. 1.

FIG. 6 is a perspective view illustrating a state in which a right edge display area, a left edge display area, and a bending area in the display apparatus of FIG. 1 are bent; FIG. 7A is a cross-sectional view of a periphery of a second left edge display area taken along a first direction in an unfolded state of the display apparatus of FIG. 1; FIG. 7B is a cross-sectional view of a periphery of a second left edge display area taken along a first direction in a folded state of the display apparatus of FIG. 1; FIG. 8A is a cross-sectional view of a periphery of a second left edge display area taken along a second direction in an unfolded state of the display apparatus of FIG. 1; FIG. 8B is a cross-sectional view of a periphery of a second left edge display area taken along a second direction in a folded state of the display apparatus of FIG. 1; and FIGS. 9A and 9B are partial plan views illustrating changes in a slit opening of a first pattern film when an edge display area of the display apparatus of FIG. 1 is bent.

Figure 9A:
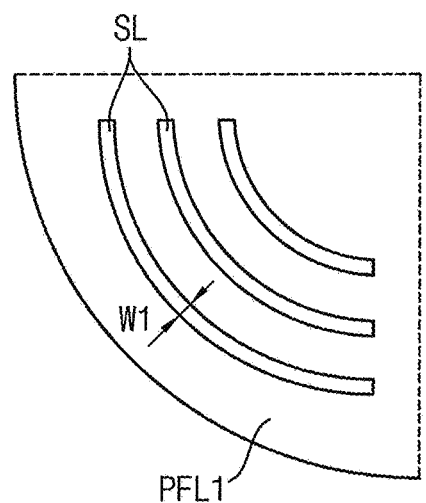
FIGS. 9A and 9B are partial plan views illustrating changes in a slit opening of a first pattern film when an edge display area of the display apparatus of FIG. 1 is bent.
Figure 9B:
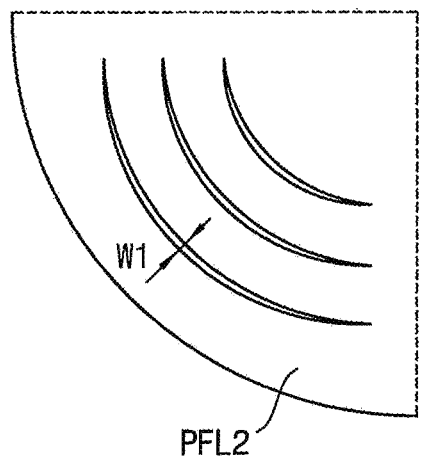

Referring to FIGS. 7A, 8A, and 9A, a state before the display panel PN is bent is illustrated. Stress is not applied to the first pattern film PFL1, and, thus, the stress is not applied to a portion of the slit opening SL corresponding to each edge portion of the first pattern film PFL1, that is, the second left edge display area LEA2, the third left edge display area LEA3, the second right edge display region REA2, and the third right edge display region REA3, and the slit opening SL may have a first width W1.

Referring to FIGS. 6, 7B, 8B, and 9B, as the left edge display area LEA of the display panel PN is bent, the stress is dispersed by the slit opening SL formed in the first pattern film positioned under the second left edge display area LEA2. A neutral plane NP, to which compression or expansion is not applied when the left edge display area LEA of the display panel PN is bent, may be positioned in the display panel PN in order to protect the configuration of the display panel PN. Accordingly, the compression may act on the first pattern film PFL1 in such a manner that the compression not only acts on a cutting surface defined in the first direction D1 and the third direction D3, but also acts in a direction to push out the first pattern film PFL1 in the second direction D2.

Figure 16:
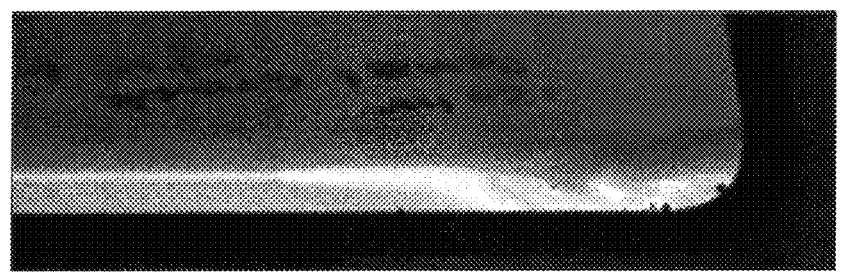
FIG. 16 is a photographic diagram illustrating breakage or cracking generated at an end of an edge display area to explain an effect of the present inventive concept.
Figure 17:
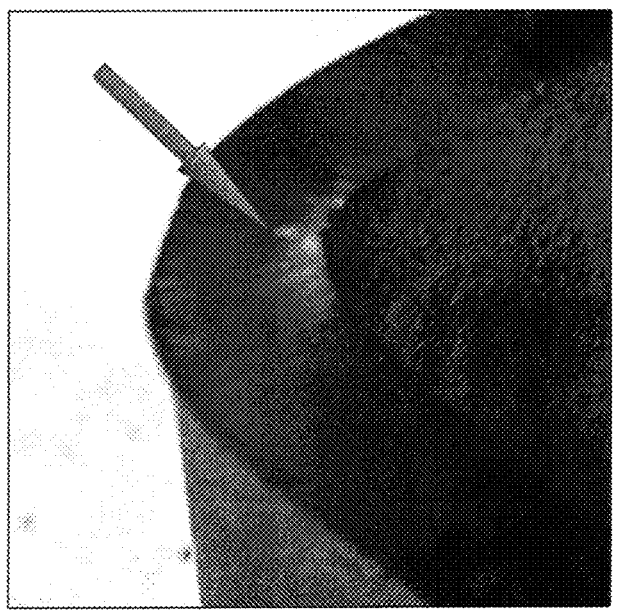
FIG. 17 is a photographic diagram illustrating push-out generated at edges as a pattern film is bent to explain an effect of the present inventive concept.

As a result, materials constituting the first pattern film PFL1 may be pushed out in the second direction D2 and swollen at the end of the first pattern film PFL1 defined in the second direction D2 due to the compression (see FIG. 16), and, thus, the display panel may be damaged and cracked at the edge portion (see FIG. 17). However, according to one or more embodiments, the stress is dispersed by the slit opening SL which may be in a state having a second width W2 smaller than the first width W1 (or a state in which wall surfaces of the slit opening come into contact with each other).

According to one or more embodiments, the stress is dispersed by the slit opening SL of the first pattern film PFL1 positioned under the second left edge display area LEA2, such that materials constituting the first pattern film PFL1 may be prevented or substantially prevented from being pushed out in the second direction D2 and swollen, thereby preventing or substantially preventing damage and cracking of the display panel at the edges of the display panel PN.

Although not described individually, the slit openings corresponding to the third left edge display area LEA3, the second right edge display area REA2, and the third right edge display area REA3 may have the same effect. As a result, damage and cracking of the display panel may be prevented or substantially prevented at the edges of the display panel PN.

Figure 10:
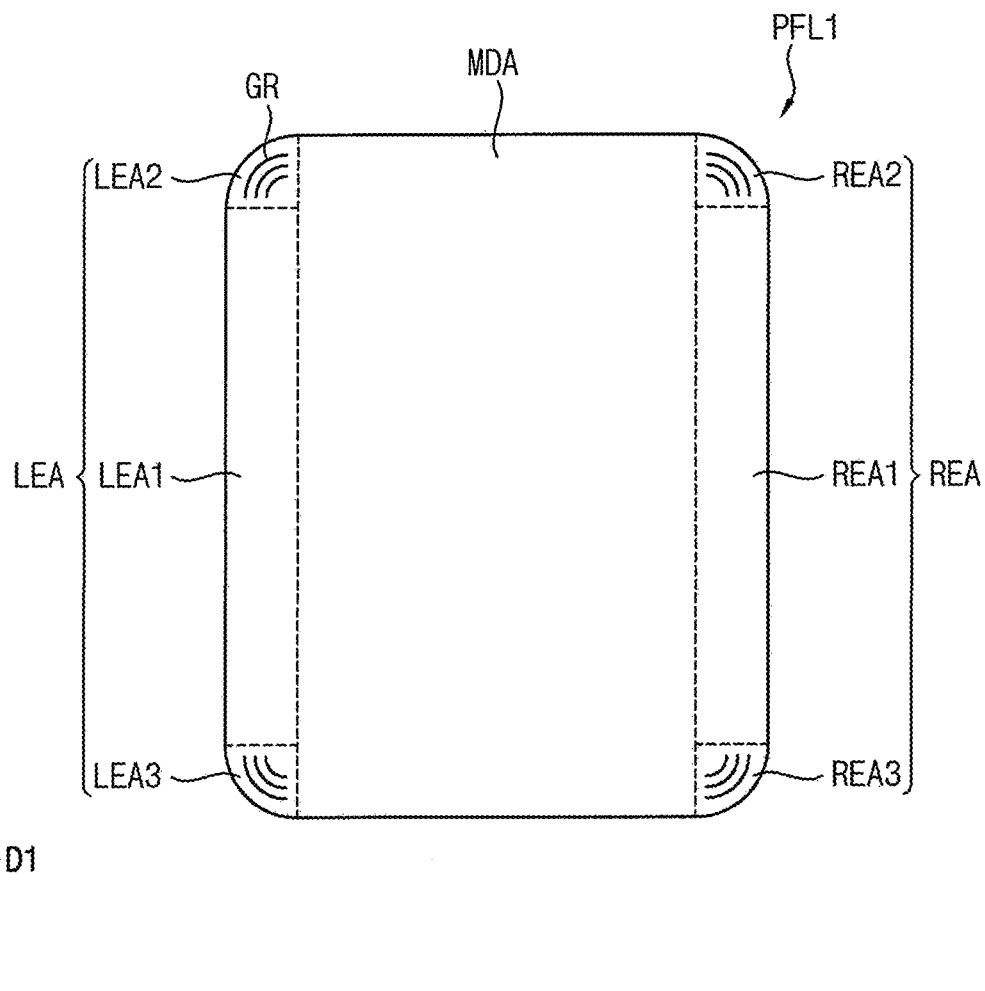
FIG. 10 is a plan view illustrating a first pattern film of a display apparatus according to one or more example embodiments.
Figure 11:
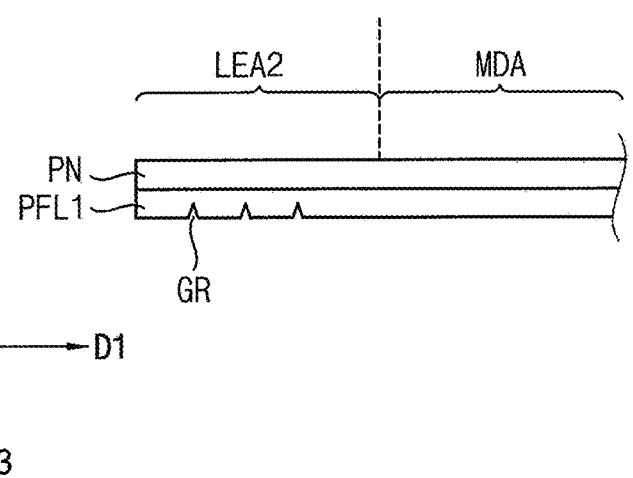
FIG. 11 is a cross-sectional view of a periphery of a second left edge display area of the display apparatus of FIG. 10, taken along a first direction.

FIG. 10 is a plan view illustrating a first pattern film of a display apparatus according to one or more example embodiments; and FIG. 11 is a cross-sectional view of a periphery of a second left edge display area of the display apparatus of FIG. 10, taken along a first direction.

Referring to FIGS. 10 and 11, the display apparatus may be substantially the same as the display apparatus described with reference to FIGS. 1 to 9B except that the stress dispersing portion is formed as a groove GR instead of the slit opening. Therefore, repeated description thereof may be omitted below.

The display apparatus may include a display panel PN and a first pattern film PFL1.

The display panel may include a main display area MDA on which an image is displayed, a right edge display area REA, and a left edge display area LEA. The right edge display area REA may include a first right edge display area REA1, a second right edge display area REA2, and a third right edge display area REA3. The left edge display area LEA may include a first left edge display area LEA1, a second left edge display area LEA2, and a third left edge display area LEA3.

Stress dispersing portions may be formed corresponding to four edges of the first pattern film PFL1 of the display apparatus, that is, the second left edge display area LEA2, the third left edge display area LEA3, the second right edge display area REA2, and the third right edge display area REA3.

The stress dispersing portion may be a groove GR formed on a surface of the first pattern film PFL1. In an embodiment, the groove GR may be formed on a surface of the first pattern film PFL1 where the first pattern film PFL1 is in contact with the display panel PN.

Although the groove GR shown in the drawings has a curved shape, embodiments of the present inventive concept are not limited thereto.

Figure 12:
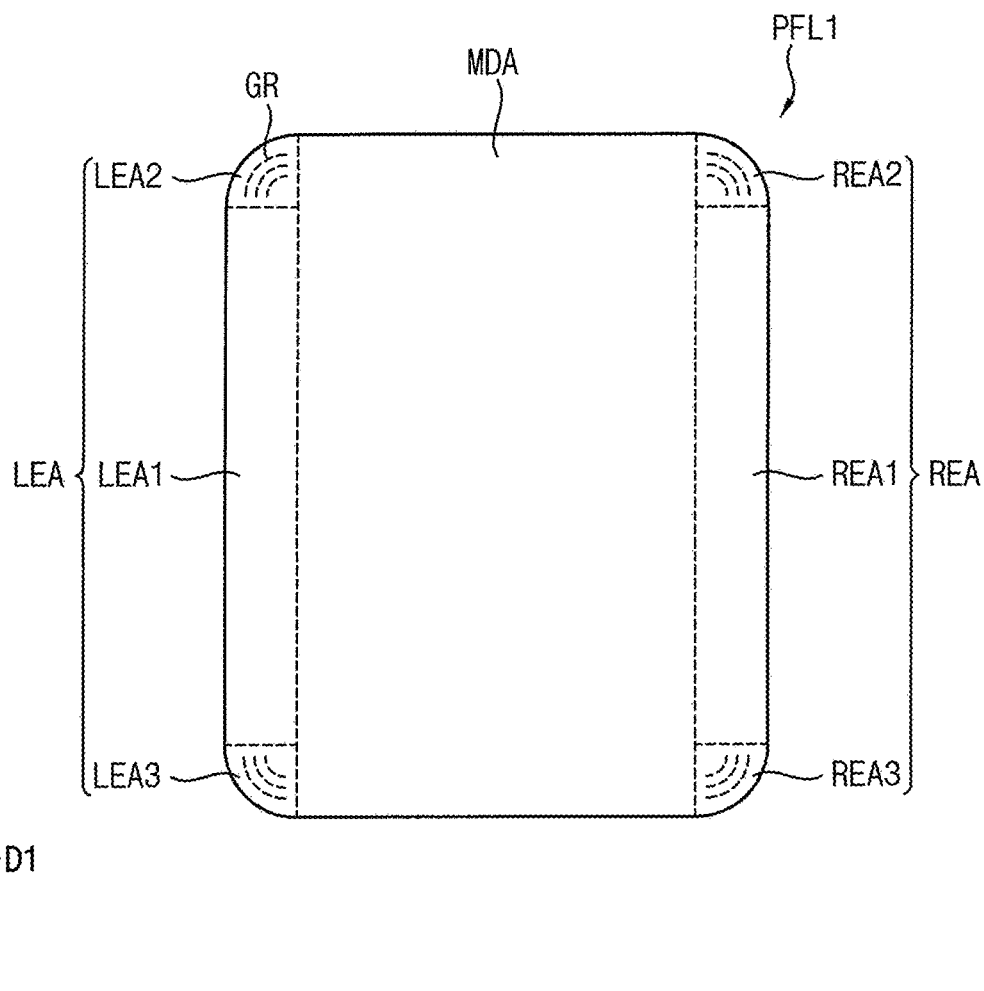
FIG. 12 is a plan view illustrating a first pattern film of a display apparatus according to one or more example embodiments.
Figure 13:
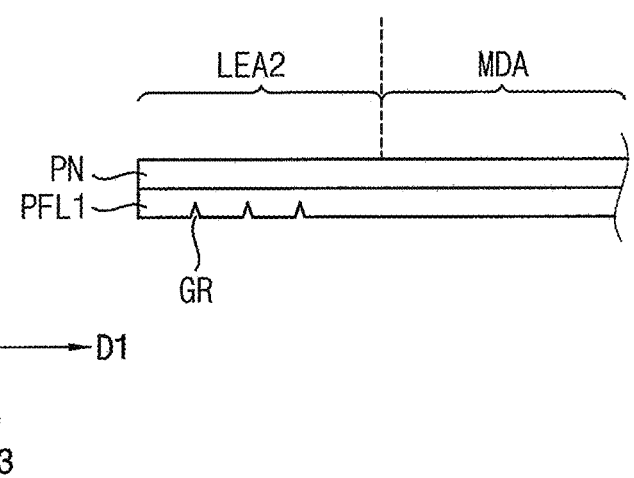
FIG. 13 is a cross-sectional view of a periphery of a second left edge display area of the display apparatus of FIG. 12, taken along a first direction.

FIG. 12 is a plan view illustrating a first pattern film of a display apparatus according to one or more example embodiments; and FIG. 13 is a cross-sectional view of a periphery of a second left edge display area of the display apparatus of FIG. 12, taken along a first direction.

Referring to FIGS. 12 and 13, the display apparatus may be substantially the same as the display apparatus described with reference to FIGS. 10 and 11 except for the position of the surface on which the groove GR is formed. Therefore, repeated description thereof may be omitted below.

The display apparatus may include a display panel PN and a first pattern film PFL1.

The display panel may include a main display area MDA on which an image is displayed, a right edge display area REA, and a left edge display area LEA. The right edge display area REA may include a first right edge display area REA1, a second right edge display area REA2, and a third right edge display area REA3. The left edge display area LEA may include a first left edge display area LEA1, a second left edge display area LEA2, and a third left edge display area LEA3.

Stress dispersing portions may be formed corresponding to four edges of the first pattern film PFL1 of the display apparatus, that is, the second left edge display area LEA2, the third left edge display area LEA3, the second right edge display area REA2, and the third right edge display area REA3.

The stress dispersing portion may be a groove GR formed on a surface of the first pattern film PFL1. In an embodiment, the groove GR may be formed on a surface of the first pattern film PFL1 opposite to a surface where the first pattern film PFL1 is in contact with the display panel PN.

Although the groove GR shown in the drawings has a curved shape, embodiments of the present inventive concept are not limited thereto.

Figure 14:
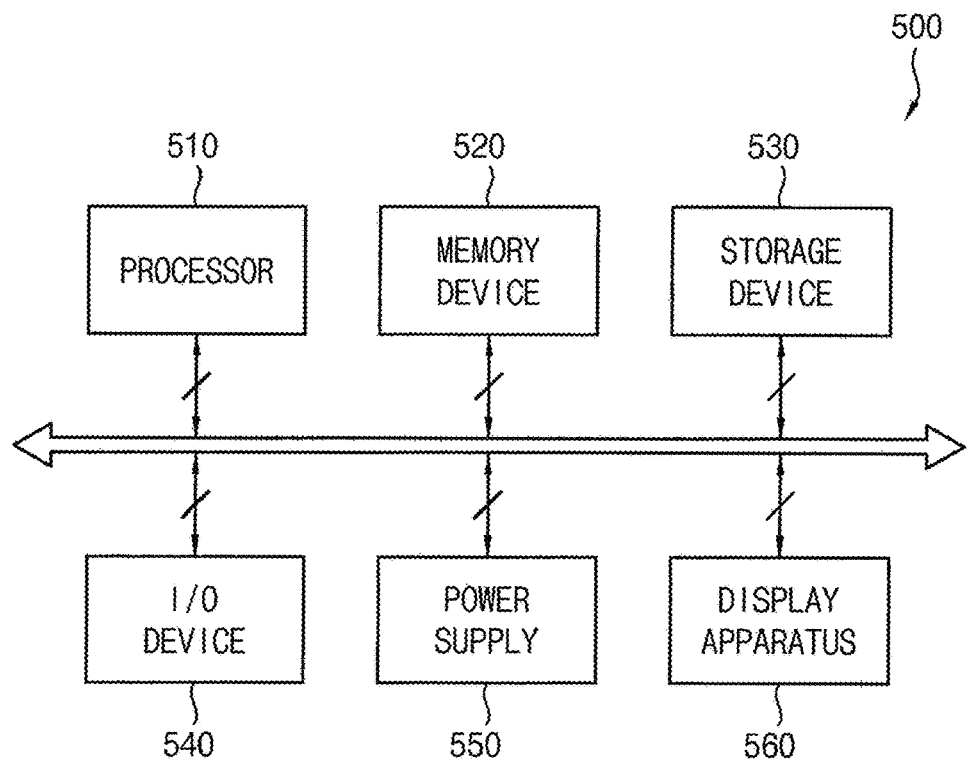
FIG. 14 is a block diagram illustrating an electronic apparatus according to one or more example embodiments.
Figure 15:
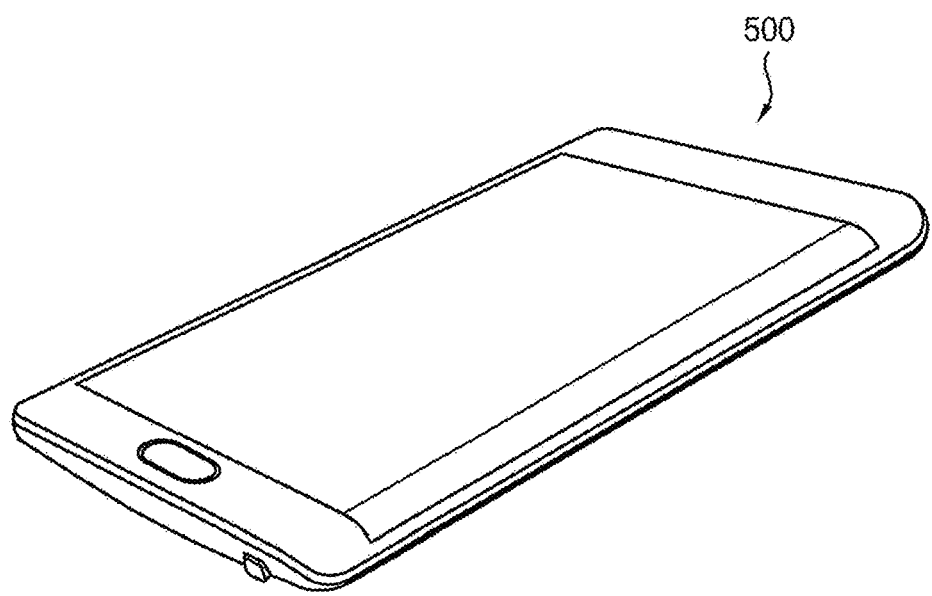
FIG. 15 is a perspective view illustrating an example in which the electronic apparatus of FIG. 14 is implemented as a smartphone.

FIG. 14 is a block diagram illustrating an electronic apparatus according to one or more example embodiments;

and FIG. 15 is a perspective view illustrating an example in which the electronic apparatus of FIG. 14 is implemented as a smartphone.

Referring to FIGS. 14 to 15, an electronic apparatus 500 according to an embodiment may include a processor 510, a memory device 520, a storage device 530, an input/output (I/O) device 540, a power supply 550, and a display apparatus 560. Here, the display apparatus 560 may be the display apparatus of FIG. 1. In addition, the electronic apparatus 500 may further include a plurality of ports for communicating with a video card, a sound card, a memory card, a universal serial bus (USB) device, other electronic apparatuses, etc. In an example embodiment, as illustrated in FIG. 15, the electronic apparatus 500 may be implemented as a smartphone. However, the electronic apparatus 500 is not limited thereto. For example, the electronic apparatus 500 may be implemented as a cellular phone, a video phone, a smart pad, a smart watch, a tablet PC, a car navigation system, a computer monitor, a laptop, a head mounted display (HMD) apparatus, etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus, such as a peripheral component interconnection (PCI) bus. The memory device 520 may store data for operations of the electronic apparatus 500. For example, the memory device 520 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device, such as a keyboard, a keypad, a mouse device, a touchpad, a touchscreen, etc., and an output device, such as a printer, a speaker, etc. The power supply 550 may provide power for operations of the electronic apparatus 500.

The display apparatus 560 may be coupled to other components via the buses or other communication links. In some example embodiments, the I/O device 540 may include the display apparatus 560. As described above, the display apparatus 560 may include a display panel having a light emitting structure and including a main display area and a curved display area adjacent to the main display area, and a first pattern film attached to a lower portion of the display panel (i.e., under the display panel) while overlapping with the main display area and the curved display area and having a stiffness higher than that of the display panel. Stress may be dispersed in the first pattern film by a stress dispersing portion in a form of a slit opening or a groove, thereby preventing or substantially preventing a material constituting the first pattern film from being pushed out and/or swollen, such that breakage and cracking of the display panel may be prevented or substantially prevented at an edge of the display panel. Since these are described above, duplicated description related thereto will not be repeated.

FIG. 16 is a photographic diagram illustrating breakage or cracking generated at an end of an edge display area to explain an effect of the present inventive concept; and FIG. 17 is a photographic diagram illustrating push-out generated at edges as a pattern film is bent to explain an effect of the present inventive concept.

Referring to FIGS. 16 and 17, push-out may be generated at the edges as the pattern film is bent such that cracking and breakage of the display panel may occur at the end of the edge display area. However, in one or more embodiments of the present inventive concept, stress may be dispersed through the slit opening, thereby preventing or substantially preventing cracking and breakage of the display panel.

One or more embodiments of the present inventive concept may be applied to a display apparatus and an electronic apparatus including the display apparatus. For example, one or more embodiments of the present inventive concept may be applied to a smartphone, a cellular phone, a video phone, a smart pad, a smart watch, a tablet PC, a car navigation system, a television, a computer monitor, a laptop, a head mounted display apparatus, etc.

The foregoing is illustrative of some example embodiments and is not to be construed as limiting thereof. Although some example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as set forth in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display apparatus comprising:
   a display panel comprising a light emitting structure and including a main display area, a left edge display area adjacent to the main display area, and a right edge display area adjacent to the main display area; and
   a first pattern film attached under the display panel and overlapping with the main display area and the left and right edge display areas, the first pattern film having a stiffness higher than a stiffness of the display panel,
   wherein a stress dispersing portion is located on the first pattern film, and
   wherein the stress dispersing portion comprises an opening having an arc shape in a plan view.

2. The display apparatus of claim 1, wherein the opening is in a form of a slit.

3. The display apparatus of claim 2, wherein the opening extends along a curved line.

4. The display apparatus of claim 1, wherein the opening comprises a plurality of slits concentrically arranged in an arc shape.

5. The display apparatus of claim 1, wherein the left edge display area comprises a first left edge display area adjacent to the main display area, and second and third left edge display areas adjacent to opposite longitudinal ends of the first left edge display area, respectively, and wherein the stress dispersing portion is located in the second left edge display area and the third left edge display area.

6. A display apparatus comprising:
a display panel comprising a light emitting structure and including a main display area, a left edge display area adjacent to the main display area, and a right edge display area adjacent to the main display area; and
a first pattern film attached under the display panel and overlapping with the main display area and the left and right edge display areas, the first pattern film having a stiffness higher than a stiffness of the display panel,
wherein a stress dispersing portion is located on the first pattern film,
wherein the stress dispersing portion comprises a groove located on a surface of the first pattern film, and
wherein the groove has a shape defined by a plurality of arcs that are concentrically arranged.

7. The display apparatus of claim 6, wherein the surface of the first pattern film on which the groove is located contacts the display panel.

8. The display apparatus of claim 6, wherein the surface of the first pattern film on which the groove is located is opposite to a surface of the first pattern film which contacts the display panel.

9. The display apparatus of claim 1, wherein the left edge display area and the right edge display area are bent in a direction perpendicular to the main display area to define curved surfaces, respectively, and
wherein a neutral plane of each of the curved surfaces is located in the display panel such that compression is applied to the first pattern film.

10. The display apparatus of claim 1, wherein the display panel further includes a bending area adjacent to the main display area, and
wherein the bending area is bent in a direction perpendicular to the main display area such that a part of the bending area faces a rear surface of the main display area to overlap with the main display area.

11. The display apparatus of claim 10, further comprising a second pattern film attached under the bending area of the display panel.

12. The display apparatus of claim 1, wherein the display panel comprises a flexible organic light emitting display panel, and the light emitting structure comprises a first electrode, an organic light emitting layer on the first electrode, and a second electrode on the organic light emitting layer.

13. The display apparatus of claim 1, wherein the first pattern film comprises polyethylene terephthalate.

14. A display apparatus comprising:
a display panel comprising a main display area on a plane defined in a first direction and a second direction perpendicular to the first direction, and a curved display area adjacent to the main display area and bent with respect to the plane in a third direction perpendicular to the first and second directions; and
a pattern film attached under the display panel,
wherein a groove or a slit opening is located in a portion of the pattern film overlapping with the curved display area, and
wherein the groove or the slit opening has an arc shape in a plan view.

15. The display apparatus of claim 14, wherein a neutral plane of the curved display area is located in the display panel such that compression is applied to the pattern film.

16. The display apparatus of claim 14, wherein the curved display area extends in the second direction, and the groove or the slit opening comprises a plurality of grooves or slit openings formed at opposite ends of the curved display area in the second direction.

17. The display apparatus of claim 16, wherein the opposite ends of the curved display area in the second direction have a rounded edge shape, and the groove or the slit opening has a curved shape adjacent to the rounded edge shape.

* * * * *